United States Patent
Sato et al.

(10) Patent No.: US 6,185,137 B1
(45) Date of Patent: Feb. 6, 2001

(54) SEMICONDUCTOR MEMORY DEVICE WITH DECREASED CURRENT CONSUMPTION

(75) Inventors: Hajime Sato; Satoru Kawamoto, both of Kasugai (JP)

(73) Assignee: Fujitsu Limited, Kawasaki (JP)

( * ) Notice: Under 35 U.S.C. 154(b), the term of this patent shall be extended for 0 days.

(21) Appl. No.: 09/457,370

(22) Filed: Dec. 9, 1999

(30) Foreign Application Priority Data

Mar. 19, 1999 (JP) .................................................. 11-0752425

(51) Int. Cl.⁷ ........................................................ G11C 7/00
(52) U.S. Cl. ......................... 365/200; 365/203; 365/226; 365/227; 365/230.03; 365/222
(58) Field of Search ..................................... 365/200, 201, 365/226, 227, 203, 222, 230.03

(56) References Cited

U.S. PATENT DOCUMENTS

| | | | |
|---|---|---|---|
| 5,410,507 | * 4/1995 | Tazunoki et al. | 365/189.09 |
| 5,668,774 | * 9/1997 | Funitani | 365/233 |
| 5,943,280 | * 8/1999 | Tsukamoto et al. | 365/222 |
| 6,038,186 | * 3/2000 | Tanizaki | 365/200 |
| 6,097,647 | * 8/2000 | Zagar et al. | 365/201 |
| 6,111,797 | * 8/2000 | Shirley | 365/200 |

FOREIGN PATENT DOCUMENTS

| | | |
|---|---|---|
| 5-128858 | 5/1983 | (JP) . |
| 8-203268 | 8/1996 | (JP) . |

* cited by examiner

Primary Examiner—Viet Q. Nguyen
(74) Attorney, Agent, or Firm—Arent Fox Kintner Plotkin and Kahn, PLLC

(57) ABSTRACT

A memory device, such as a DRAM, includes multiple cell blocks, each having bit lines and word lines. Block control circuits are connected to respective ones of the cell blocks. The block control circuits supply a precharge signals to their associated cell blocks. A block control circuit which is connected to a defective cell block generates a precharge signal having a precharge level of the bit lines and a reset level of the word lines in accordance with an access condition of the defective cell block. The block control circuit sets the precharge signal to the precharge level when the defective cell block is activated and to the reset level when it is deactivated.

12 Claims, 12 Drawing Sheets

Fig.8
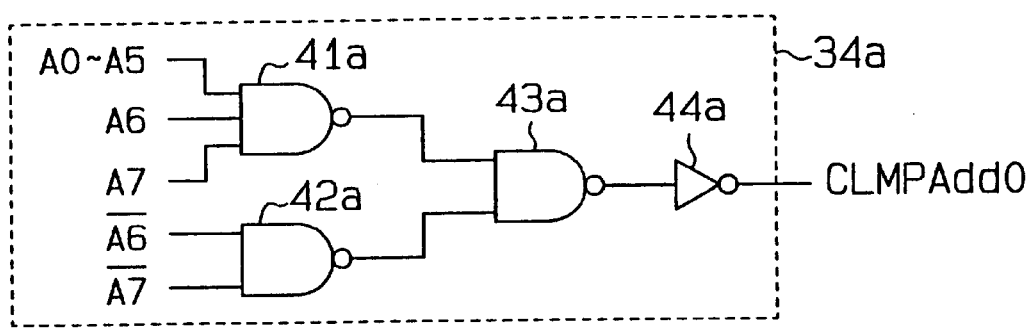
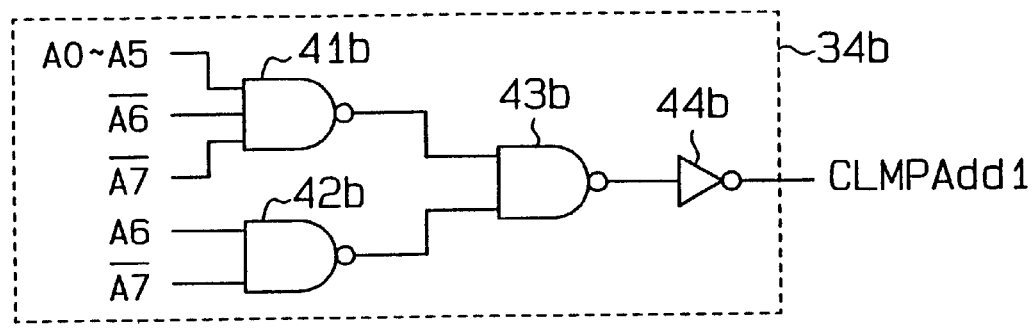
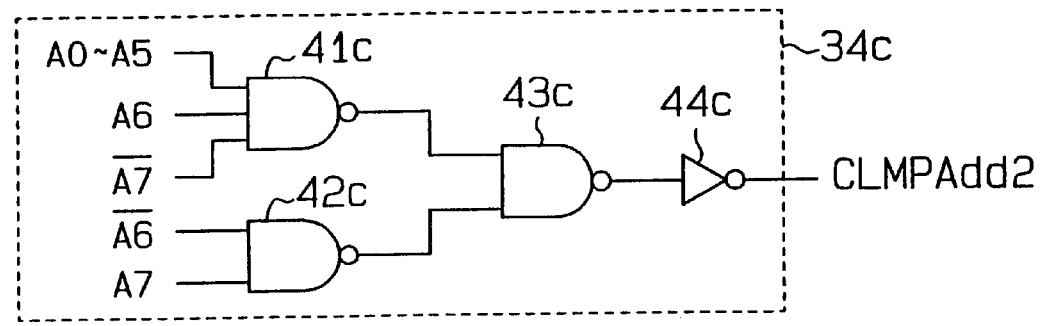
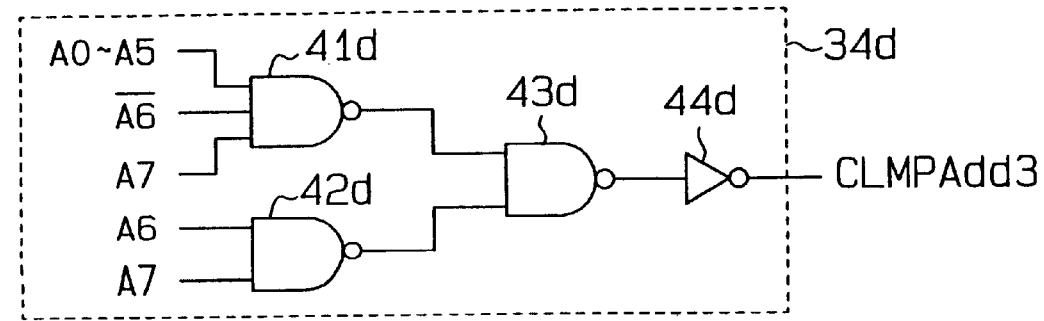

Fig.9

| CLMPAdd0 | CLMPAdd1 | CLMPAdd2 | CLMPAdd3 | Block Selection Address Signals | | | | | | | | Selected Block Number |
|---|---|---|---|---|---|---|---|---|---|---|---|---|
| | | | | A7 | A6 | A5 | A4 | A3 | A2 | A1 | A0 | |
| L | H | | | 0 | 0 | 0 | 0 | 0 | 0 | 0 | 0 | 0 |
| | | | | 0 | 0 | 0 | 0 | 0 | 0 | 0 | 0 | |
| | | | | 0 | 0 | 0 | 0 | 0 | 0 | 0 | 0 | |
| | | | H | ⋮ | | | | | | | | |
| | | | | 0 | 0 | 1 | 1 | 1 | 1 | 1 | 1 | |
| | | H | | 0 | 1 | 0 | 0 | 0 | 0 | 0 | 0 | 1 |
| | L | | | 0 | 1 | 0 | 0 | 0 | 0 | 0 | 1 | |
| | | | | ⋮ | | | | | | | | |
| | | | | 0 | 1 | 1 | 1 | 1 | 1 | 1 | 1 | |
| H | L | | | 1 | 0 | 0 | 0 | 0 | 0 | 0 | 0 | 2 |
| | | | | 1 | 0 | 0 | 0 | 0 | 0 | 0 | 1 | |
| | | | | ⋮ | | | | | | | | |
| | | H | | 1 | 0 | 1 | 1 | 1 | 1 | 1 | 1 | |
| | H | | L | 1 | 1 | 0 | 0 | 0 | 0 | 0 | 0 | 3 |
| | | | | 1 | 1 | 0 | 0 | 0 | 0 | 0 | 1 | |
| | | | | ⋮ | | | | | | | | |
| L | | | | 1 | 1 | 1 | 1 | 1 | 1 | 1 | 1 | |

SEMICONDUCTOR MEMORY DEVICE WITH DECREASED CURRENT CONSUMPTION

BACKGROUND OF THE INVENTION

The invention relates to a semiconductor memory device, and more particularly, to a reduction in the power dissipation in a self-refresh operation of a dynamic random access memory (DRAM).

A DRAM used in a portable unit such as a personal computer receives power from a storage battery of the portable unit to perform a self-refresh operation to maintain data which has been written to it. Accordingly, the battery dissipates power to maintain the stored data even when the portable unit is not operating. To preserve power enhance the operable time interval of the portable unit, the power dissipation for the self-refresh operation of the DRAM must be reduced.

FIG. 1 is a schematic block diagram of a conventional DRAM 11.

The DRAM 11 includes a plurality of cell blocks, four are shown here, BLK0–BLK3. Each of the cell blocks BLK0–BLK3 comprises a memory cell array 12, a row decoder 13, an equalizer 14, a sense amplifier bank 15 and a column decoder 16. Only the cell block BLK0 is shown in detail in FIG. 1.

The memory cell array 12 comprises a plurality of bit line pairs BL0, /BL0 to BLm, /BLm, a plurality of word lines WL0 to WLn, and a plurality of memory cells C (see FIG. 2). Each memory cell C comprises a single transistor and a single capacitor which are connected to an associated intersection of the bit line pairs BL0, /BL0 and the word lines WL0 to Wln.

The row decoder 13 receives an external address EXAdd provided via a switch 17 as an address signal Add and activates one of the word lines WL. Assume now that a word line WLi is activated by the row decoder 13 as shown in FIG. 2. The column decoder 16 responds to a column address which is externally supplied to turn on a data bus switch 18 to connect the bit line pair BLi, /BLi to a data bus pair DBi, /DBi. Information stored in the memory cell C is read from the bit line BLi, amplified by the sense amp 15, and delivered externally on the data bus pair DBi, /DBi.

A refresh operation will now be described. A row control circuit 21 receives a row control signal /RAS and a column control signal /CAS, enters a CBR refresh mode when "CAS before RAS" or CBR condition is detected, which means that the falling edge of the column control signal CAS occurs earlier than that of the row control signal /RAS as shown in FIG. 3, and delivers a control signal M1 to the switch 17 for controlling the CBR refresh operation.

In this mode, the row control circuit 21 delivers a refresh clock signal RCLK to a refresh address counter 22, which counts the clock signal RCLK to generate a refresh address signal IAdd, which is then applied to the switch 17. In response to the control signal M1, the switch 17 passes the refresh address signal IAdd from the counter 22 to the row decoder 13 of the respective cell block BLK0–BLK3. The row decoder 13 of the cell block BLK0 activates the initial word line WL0 in response to the refresh address signal IAdd. The memory cell C connected to the activated word line WL0 is then refreshed.

Specifically, referring to FIG. 2, the sense amp 15 of the cell block BLK0 is activated by an H level power supply PSA and an L level power supply NSA, and when activated, amplifies a signal read from the bit line. The memory cell C connected to the activated word line WL0 is refreshed in this manner.

When the memory cell C is refreshed, a reset operation takes place automatically, thus precharging the bit line.

Specifically, the row control circuit 21 delivers an equalize signal EQ of an H level to the equalizer circuit 14, which is supplied with a precharge signal PR of a given potential (which may be equal to one-half Vdd, for example) from a bit line precharge circuit 23, where Vdd is a power supply used to operate various circuits.

As shown in FIG. 2, the equalizer circuit 14 comprises a pair of N-channel MOS transistors connected between the bit line pair BLi, /BLi, with the equalize signal EQ being applied to the gates of the transistors and the precharge signal PR being applied to the node between the transistors. In response to the equalize signal EQ of the H level, the equalizer circuit 14 precharges the bit line pair BLi, /BLi to the potential of the precharge signal PR (which is one-half Vdd).

A self-refresh mode is entered after a given time interval has passed from when the memory cell C connected to the initial word line WL0 of the cell block BLK0 is refreshed in the CBR refresh mode. In the self-refresh operation, a memory cell C connected to a word line located next to the word line having the refreshed memory cell connected to it (i.e., the second word line WL1 of the cell block BLK0) is similarly refreshed. When a memory cell C connected to the last word line Wln of the cell block BLK0 has been refreshed, the refresh operation for all the memory cells C in the cell block BLK0 is completed.

Subsequently, the word lines of the cell block BLK1 are successively activated to refresh the connected memory cells. In a similar manner, the memory cells C in the cell blocks BLK2 and BLK3 are refreshed. When the refresh operation for the memory cell C connected to the last word line of the cell block BLK3 is completed, the count value of the refresh address counter shown in FIG. 1 is reset, returning to the initial refresh address or delivering the refresh address signal IAdd for the word line WL0 of the cell block BLK0.

Salvaging of a defect in the memory cell C will now be described. As shown in FIG. 1, the DRAM 11 also comprises a redundancy decision circuit 24, and the memory cell array 12 includes a redundant word line RWL, which is connected to a redundant word line drive circuit 25 in the row decoder 13.

An address of a defective cell which was previously detected by a test, is stored within the redundancy decision circuit 24, which determines whether the address Add from the switch 17 coincides with the stored defective address and delivers a redundancy control signal ROM to the row decoder 13. By way of example, assume that the circuit 24 delivers a redundancy control signal ROM having an H level for the coincidence between the defective address and the address Add. In response to the high redundancy control signal ROM, the row decoder 13 does not activate a word line which was chosen in accordance with the address Add. The redundant word line drive circuit 25 activates the redundant word line RWL in response to the redundancy control signal ROM. As a consequence, a read/write access as well as a refresh operation take place with respect to a memory cell C connected to the redundant word line RWL rather than with respect to the memory cell C connected to the word line at the defective address.

The current consumed during the refresh operation (or refresh current) comprises a DC current component representing a steady-state consumption and an AC current component representing a consumption during the memory cell refresh operation. The DC component represents the consumption by the bit line precharge circuit 23 and the refresh address counter 22, while the AC component represents the current required for driving the word line WLi and an operating current of the sense amp 15.

However, it should be noted that if a defective location is replaced by a redundant memory cell which allows a normal read/write operation through an address conversion, this does not physically remove the current consumed by the defective location. That is, there is a current flow through the defective location, which increases the DC component.

As shown in FIG. 5, suppose that there is an electrical short circuit across a word line WL and a bit line BL. The sense amp 15 connected to the bit line BL is supplied with the precharge signal PR from the bit line precharge circuit 23, whereby the bit line BL is precharged to one-half Vdd. On the other hand, the word line WL is connected to a word line drive circuit 26 and is set to a low potential (a ground potential), when it is not activated. Thus, there occurs a steady-state leak current from the bit line BL to the word line WL, as indicated by an arrow.

Defective locations usually occur in a random manner, and the number of such locations increases with an increase in the integration level of memory cells and the sophistication of the fabrication process. As a consequence, the power dissipation during the self-refresh operation increases by an amount corresponding to the steady-state current flow through the defective location or locations, thus increasing power consumption.

Japanese Unexamined Patent Application No.5-128858 discloses a method for reducing a current flow through a defective location. In the method, the bit line is precharged at one-half Vdd level immediately before the read operation and is maintained at the ground potential except for during the read operation, to reduce a defective current. However, the method requires placing all the bit lines at the ground potential when the refresh operation takes place for all the word lines of the memory cell array inclusive of both non-defective and defective locations. This means that the precharge-ground potential (discharge) process takes place even for the refresh operation for a defect-free normal address, and this wasteful operation increases the AC current component, leading to an increase in the power dissipation. In addition, the disposition of a circuit which establishes a ground potential on the bit line pairs and a ground potential line connected to the circuit within the memory array increases the chip area.

Japanese Unexamined Patent Application No. 8-203268 discloses another method which eliminates a leak current path caused by a cross-line defect between a word line and a bit line by maintaining the bit line in a floating state when the memory cell is not accessed. By setting the bit line in a floating state, any charge which remains on the bit line is restored to the precharged level, so that an increase in the AC current component is prevented when a control is exercised uniformly for all addresses, irrespective of whether they are non-defective or defective.

However, the second method is not practicable. In a DRAM in particular, a charge of a minimal quantity stored in a capacitor which is made as small as possible is applied to a bit line as information for a memory cell, and a minimal amplitude on the bit line is differentially amplified. Accordingly, if the bit line is floating, noise generated in the substrate or opposing electrodes of a memory cell having increased capacitances may cause the bit line to have an unexpected value due to an electrostatic coupling, and in worst cases, may change the content stored in the cell storage capacitor and thus destroy the information.

It may be contemplated, as modifications of the above method, that only a defective bit line be controlled from its precharge level to the ground level or be made floating. However, this requires the provision of a wiring for all of the bit lines which supply a control signal or of fuses to allow disconnection, and thus requiring a substantial increase in the chip area.

SUMMARY OF THE INVENTION

It is an object of the invention to provide a semiconductor memory device which reduces a current flow due to process errors.

In one aspect of the present invention, a semiconductor memory device including a plurality of cell blocks each having bit lines and word lines is provided. A plurality of block control circuits are connected to the plurality of cell blocks, respectively, and supply a precharge signal to the bit lines of an associated cell block. The block control circuit corresponding to a defective cell block generates the precharge signal having one of a precharge level of the bit lines and a reset level of the word lines in accordance with an access condition of the defective cell block.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 8 is a circuit diagram of a clamp address decision circuit of the present invention;

FIG. 9 is a chart illustrating the operation of the clamp address decision circuit of FIG. 8;

DETAIL DESCRIPTION OF THE PREFERRED EMBODIMENTS

Figure 1:
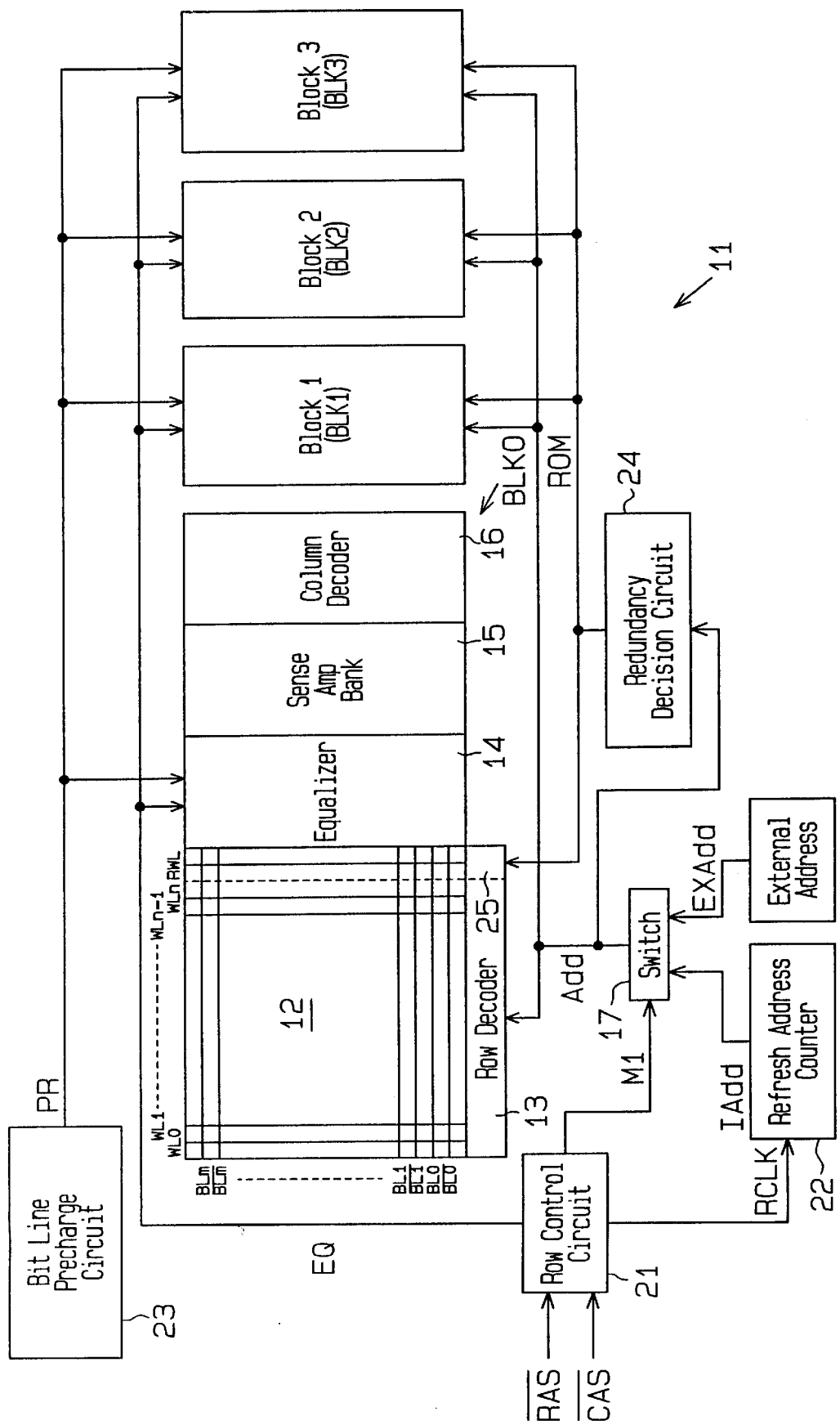
FIG. 1 is a schematic block diagram of a conventional DRAM.

In the drawings, like numerals are used for like elements throughout.

Figure 6:
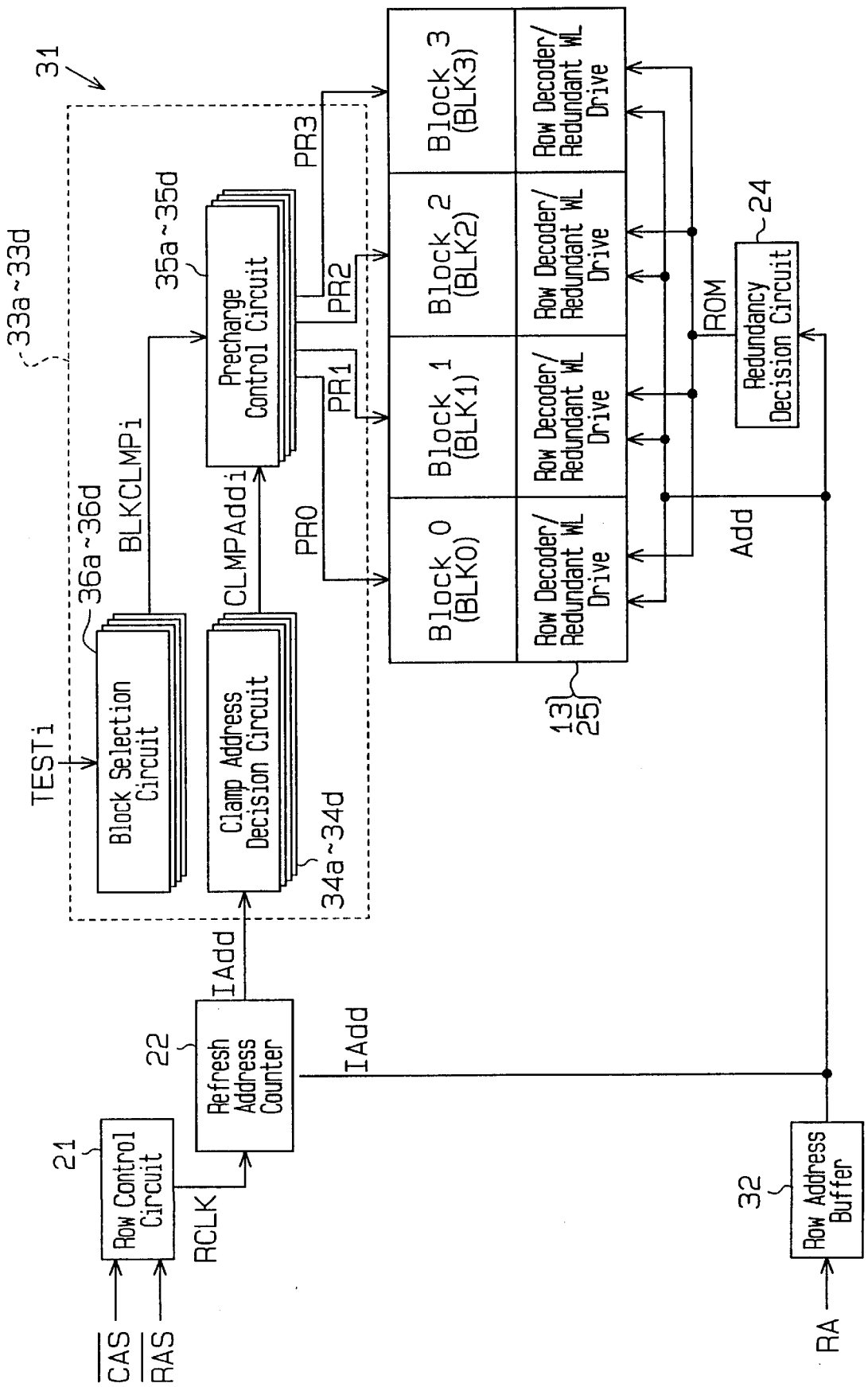
FIG. 6 is a schematic block diagram of a DRAM according to one embodiment of the present invention.

FIG. 6 is a schematic block diagram of a dynamic random access memory (DRAM) 31 according to one embodiment of the present invention. The DRAM 31 comprises four cell blocks BLK0–BLK3, each of which includes a memory cell array 12 and an access control circuit including a low decoder 13, an equalizer circuit 14, a sense amplifier bank 15 and a column decoder 16 (see FIG. 1).

The DRAM 31 of the present embodiment includes eight row addresses, and is externally supplied with a row address signal RA, which is provided via a row address buffer 32 to supply address signals Add (A7 to A0) to the cell blocks BLK0–BLK3.

Each of the cell blocks BLK0–BLK3 includes 64 word lines WL0–Wln (n=64) and a redundant word line RWL. One of the cell blocks BLK0–BLK3 is selected by address signals A7, A6, and one of the word lines WL0–Wln in the selected cell block is selected by address signals A5–A0. A read/write operation is normally performed to a memory cell C located at the point of intersection between the selected single word line WL and the selected bit line pair BLi, /BLi.

A refresh address signal IAdd is supplied from a refresh address counter 22 to each of the cell blocks BLK0–BLK3. The refresh address signal IAdd functions in a manner similar to the address signal RA, which is externally supplied to the cell blocks BLK0–BLK3, and hence the same address signals A7 to A0 will be used in the following description.

One of the cell blocks BLK0–BLK3 is selected by address signals A7, A6, and either one of the plurality of word lines WL0–Wln or the redundant word line RWL is activated by address signals A5–A0, in the same manner as done in normal operation. This selection between the word lines WL0–Wln and the redundant word line RWL is performed in accordance with the redundancy control signal ROM supplied from the redundancy decision circuit 24 to the row decoder 13 (or redundant word line drive circuit 25).

A defective address previously detected by a test is stored in the redundancy decision circuit 24, which determines if the address signal Add coincides with the defective address, and generates the redundancy control signal ROM based on a result of such decision to the row decoder 13. For example, when the address signal Add coincides with the defective address, the redundancy decision circuit 24 generates a high redundancy control signal ROM.

The row decoder 13 activates the redundant word line RWL in response to the redundancy control signal ROM having the H level, and activates a word line WLi corresponding to the address signal Add in response to the redundancy control signal ROM having the L level. The plurality of memory cells C connected to the activated word line WLi (or the redundant word line RWL) are thus refreshed.

The DRAM 31 includes a plurality of block control circuits 33a–33d corresponding to the respective cell blocks BLK0–BLK3. The block control circuits 33a–33d supply precharge signals PR0–PR3 each having a predetermined level (one-half the supply voltage Vdd) to the cell blocks BLK0–BLK3, respectively.

A refresh address signal IAdd is provided to each of the block control circuits 33a–33d from a refresh address counter 22. Block selection information associated with the cell blocks BLK0–BLK3 is stored in the block control circuits 33a–33d. The block control circuits 33a–33d control the level of the precharged signal PR0–PR3 supplied to the respective cell blocks BLK0–BLK3 in accordance with the address signal IAdd and the block selection information.

More specifically, each of the cell blocks BLK0–BLK3 which contains a defective address, as determined previously by a test, stores "controlled" block selection information. A defective address referred to herein represents an address where a cross-line defect is present to cause an electrical short circuit across a bit line and a word line, and a cell block which contains such a defective address exhibits a greater current consumption than the remaining cell blocks which do not contain a defective address.

The block control circuits 33a–33d control the level of the precharge signal PRi supplied to any cell block BLKi (i=0 to 3) containing a defective address in accordance with the block selection information. More specifically, each of the block control circuit 33a–33d sets a level for the precharge signal PRi which is equal to the reset level of the word line WLi. This reduces the current flow through the cross-line defect across the bit line pair BL, BL and the word line WLi to zero, thus reducing the current consumption.

For any cell block BLKi which does not contain a defective address, each of the block control circuits 33a–33d stores "non-controlled" block selection information. Each of the block control circuits 33a–33d supplies the precharge control signal PRi having a given level (one-half Vdd) to any cell block BLKi for which the "non-controlled" block selection information is stored. In this manner, the current consumption or power dissipation is reduced by an amount which accrues from avoiding a charge-discharge process as compared with the prior art where the precharge signal is controlled for all of the bit lines.

When a plurality of cell blocks contain a defective address, the "controlled" information may be set for the all or part of these cell blocks. In the partial "controlled" information setting, the information is preferably set to the cell block where many defective addresses are included. Alternatively, "controlled" information may be set to the cell block where a great amount of current is consumed based on the value of defect currents determined by a test. The value of defect currents are defined as a difference between the current consumption of a cell block which does not contain a defective address and the current consumption of a cell block containing such a defect.

Each of the block control circuits 33a–33d comprises a clamp address decision circuit 34a–34d, a precharge control circuit 35a–35d and a block selection circuit 36a–36d.

Each of the clamp address decision circuits 34a–34d receives the refresh address signal IAdd and provides an address decision signal CLMPAddi (i=0 to 3) to each of the precharge control circuits 35a–35d at a timing depending on the activation of the cell blocks BLK0–BLK3. Each of the precharge control circuits 35a–35d outputs a precharge signal PR0–PR3 having a read reference level of the sense amp 15 in response to an address decision signal CLMPAddi having an L level and outputs a precharge signal PR0–PR3 having a reset level (i.e., a ground level) of the word line Wli in response to an address decision signal CLMPAddi having an H level. While the read reference level is set to one-half the supply voltage Vdd in the present embodiment, this level may be changed as desired.

Figure 7:
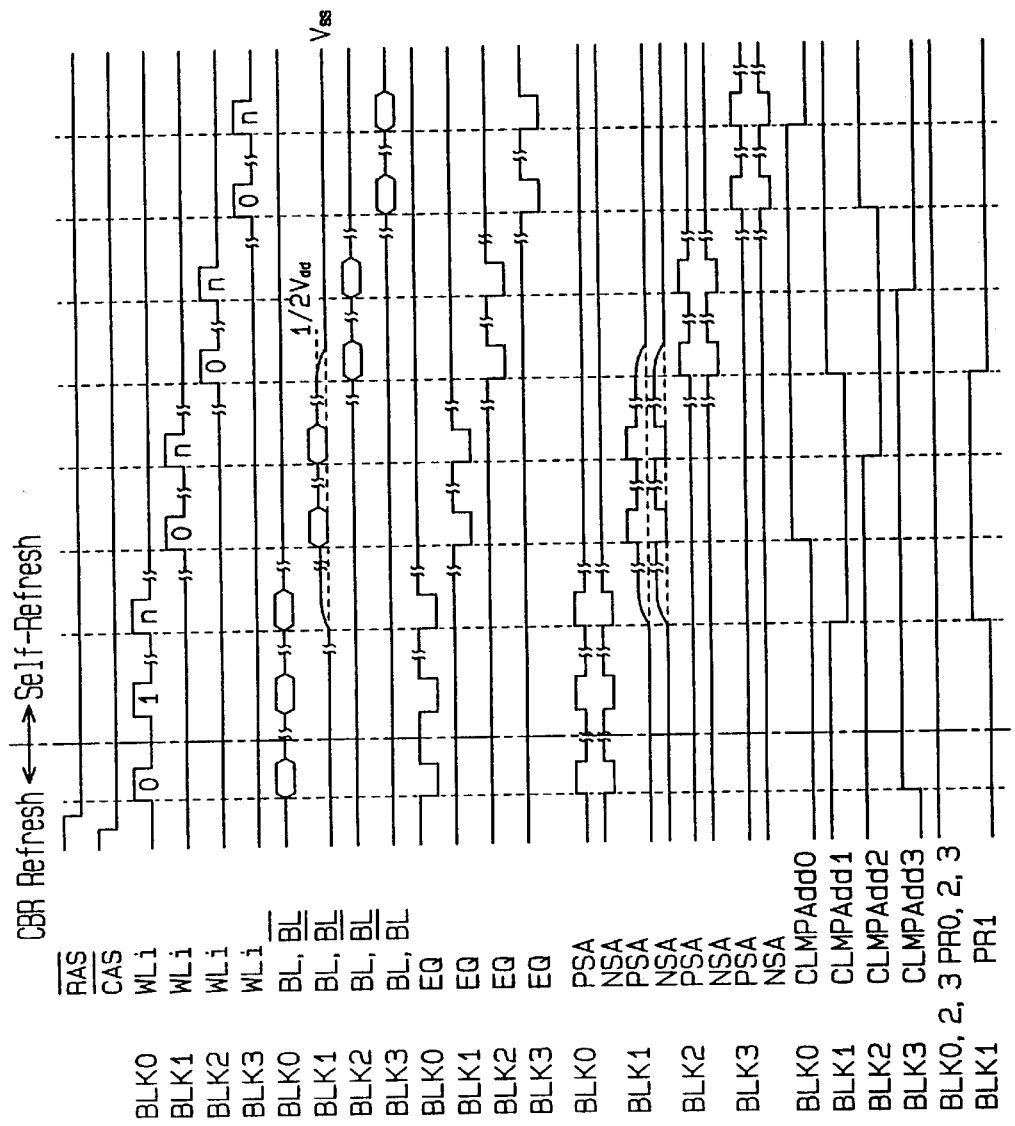
FIG. 7 is a series of timing diagrams illustrating a refresh operation of the DRAM of FIG. 6.

Specifically, as shown in FIG. 7, when the last word line Wln of the cell block BLK3, which is activated prior to the corresponding cell block BLK0, is activated, the clamp address decision circuit 34a outputs an address decision signal CLMPAdd0 having an L level. Similarly, when the last word line Wln of the respective cell blocks BLK0, BLK1 and BLK2, which are activated prior to the respective corresponding cell blocks BLK1, BLK2 and BLK3, is activated, the clamp address decision circuits 34b, 34c and 34d output address decision signals CLMPAdd1, CLMPAdd2 and CLMPAdd3 each having an L level, respectively.

The clamp address decision circuit 34a also outputs an address decision signal CLMPAdd0 having an H level when the corresponding cell block BLK0 is deactivated. Similarly, the clamp address decision circuits 34b, 34c and 34d output address decision signals CLMPAdd1, CLMPAdd2 and CLMPAdd3 each having an H level, respectively, when their corresponding cell blocks BLK1, BLK2 and BLK3 are deactivated.

By controlling the level of the precharge signal PR0–PR3 with such timing, the current consumption is reduced without retarding the precharge operation of the memory cell C. In this manner, the memory cell C in the activated cell block BLK0–BLK3 is refreshed in accordance with the precharge signal PR0–PR3 having a level equal to one-half Vdd. Accordingly, a refresh operation takes place rapidly by supplying the precharge signal PR0–PR3 of the level equal to one-half Vdd before each cell block BLK0–BLK3 is activated. If the precharge signal PR0–PR3 is supplied too early, a current flow through the cross-line defect occurs, increasing the current consumption.

Each of the block selection circuits 36a–36d provides a control signal BLKCLMPi (i=0 to 3) having a level corresponding to the set block selection information, to each of the precharge control circuits 35a–35d, each of which then controls the level of the precharge signal PR0–PR3 in response to the control signal BLKCLMPi having an H level.

A test signal TESTi (i=0 to 3) is provided to each of the block selection circuits 36a–36d. The test signal TEST1 is externally applied during testing, and is used in specifying particular one of the cell blocks BLK0–BLK3 for which the block selection information is to be set. Each of the block selection circuits 36a–36d generates the control signal BLKCLMPi having a level which depends on the test signal TESTi. The precharge control circuits 35s–35d in turn control the precharge signals PR0–PR3 in accordance with the level of the control signal BLKCLMPi. Accordingly, by setting a suitable level of the test signal TESTi during testing, the precharge level of the bit line pair BL, BL in each cell block BLK0–BLK3 is forcibly controlled, thus determining the current consumption or defect current passing through the cross-line defect occurring due to an electrical short circuit between the bit line pair BL, BL and the word line WL.

FIG. 7 is a timing diagram of a refresh operation. Assume now that there is a defective address within the cell block BLK1, and "controlled" block selection information is stored in the corresponding block selection circuit 36b while "non-controlled" block selection information is stored in the remaining block selection circuits 36a, 36c and 36d.

The row control circuit 21 enters the CBR refresh mode when the CBR (CAS before RAS) condition is detected which means that the falling edge of the column control signal /CAS is earlier than the falling edge of the row control signal /RAS based on the row control signal /RAS and the column control signal /CAS. In this mode, the row control circuit 21 provides a refresh clock signal RCLK to the refresh address counter 22, which then counts the clock signal RCLK and generates a refresh address signal IAdd, which is provided to the row decoders 13 of the cell blocks BLK0–BLK3. The row decoder 13 of the cell block BLK0 activates the initial word line WL0 in response to the refresh address signal IAdd.

The sense amp 15 of the cell block BLK0 is activated by the voltage Vdd of the high power supply PSA and the voltage Vss of the low power supply NSA and amplifies the signal read from the bit line. The amplified signal is written to the memory cell C again, whereby the memory cell C connected to the activated word line WL0 is refreshed.

When the memory cell C connected to the first word line WL0 is refreshed, a reset operation takes place automatically, precharging the bit line. Thus, referring to FIGS. 1 and 7, the row control circuit 21 provides the equalizer signal EQ having an H level to the equalizer circuit 14. The precharge control circuit 35a provides the precharge signal PR0 having a level equal to one-half Vdd to the equalizer circuit 14 in response to the control signal BLKCLMP0 supplied from the block selection circuit 36a. As a consequence, the equalizer circuit 14 precharges the bit line pair BL, BL to the level equal to one-half Vdd.

Figure 3:
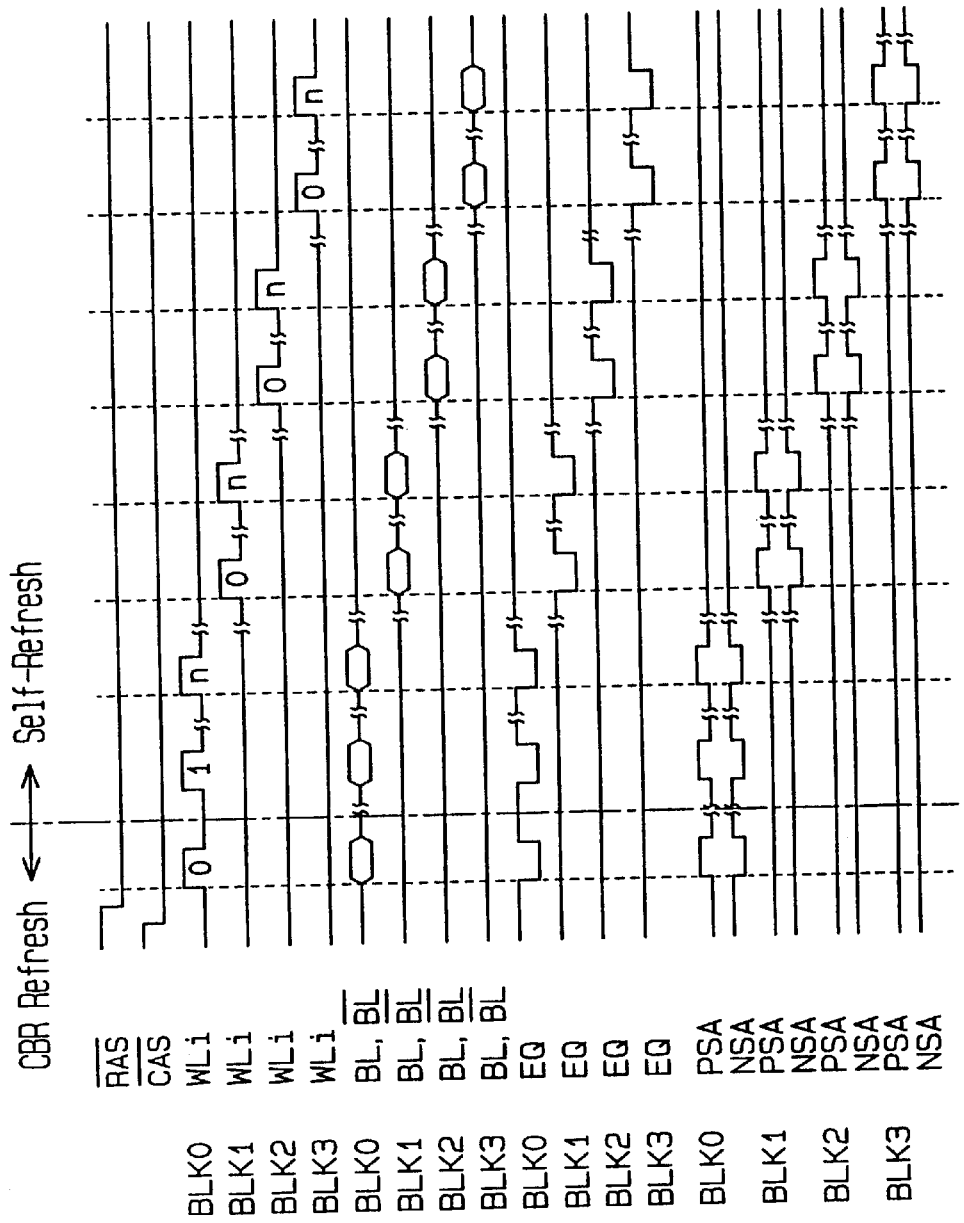
FIG. 3 is a timing diagram illustrating a refresh operation of the DRAM of FIG. 1.
Figure 4:
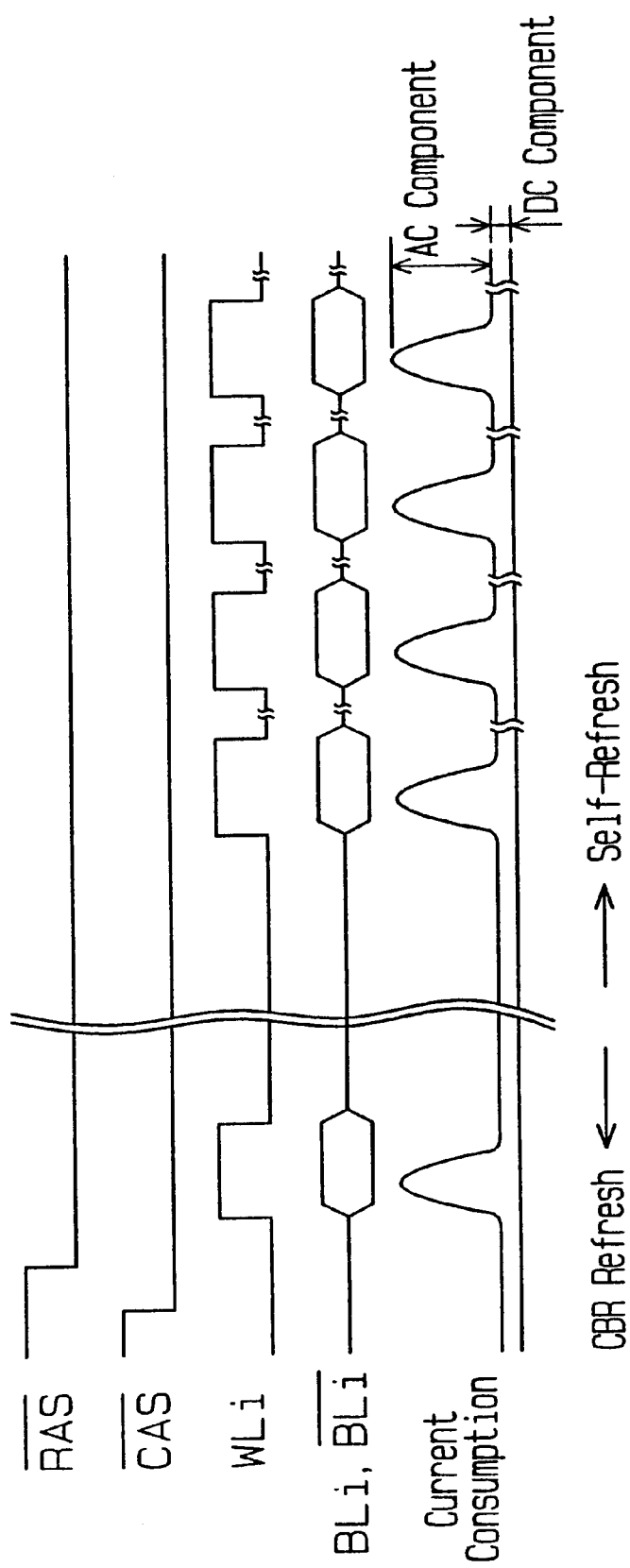
FIG. 4 is a waveform diagram illustrating current consumption of the DRAM of FIG. 1.
Figure 5:
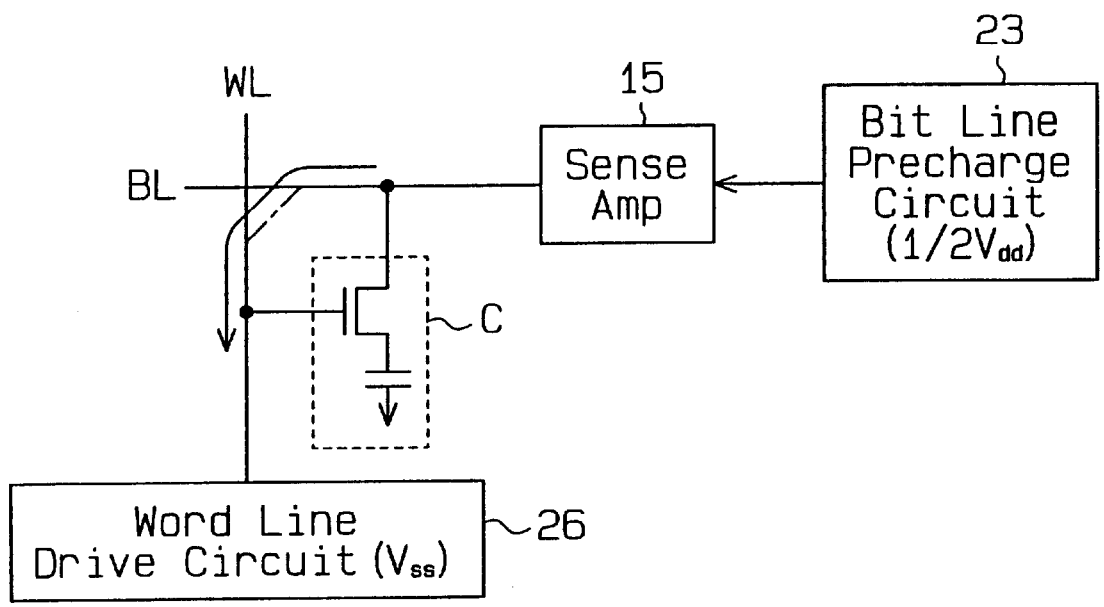
FIG. 5 is a circuit diagram for illustrating a defective current.

After refreshing the memory cell C connected to the initial word line WL0 of the cell block BLK0 in the CBR refresh mode, the self-refresh mode occurs at a predetermined time interval thereafter. In the self-refresh mode, the memory cell C connected to the second word line WL1 of the cell block BLK0 is refreshed as shown in FIG. 3. When the memory cell C connected to the last word line Wln of the cell block BLK0 is refreshed, a refresh operation for all of the memory cells C of the cell block BLK0 is completed.

When the refresh operation is performed on the cell block BLK0, the precharge control circuit 35b corresponding to the next cell block BLK1 provides the precharge signal PR1 having the ground level in accordance with the control signal BLKCLMP1 having the H level from the block selection circuit 36b and the address decision signal CLMPAdd1 having the H level from the clamp address decision circuit 34b. The precharge signal PR1 is provided to the equalizer circuit 14 of the cell block BLK1. Since the equalize signal EQ having the H level is applied to the equalizer circuit 14 from the row control circuit 21, the potential on the bit line pair BL, BL of the cell block BLK1 is controlled to the ground level, which is the same as the reset potential of the word line WL0–Wln. Consequently, there is no current flow through the cross-line defect which is present within the cell block BLK1, thus eliminating any unwanted or unnecessary current consumption.

When the last word line Wln of the cell block BLK0 is activated, the precharge control circuit 35b associated with the next cell block BLK1 is supplied with the address decision signal CLMPAdd1 having the L level from the clamp address decision circuit 34b. The precharge control circuit 35b provides the precharge signal PR1 having the level equal to one-half Vdd to the cell block BLK1 in response to the address decision signal CLMPAdd1. Consequently, the bit line pair BL, BL of the cell block BLK1 is precharged to the reference or reset level.

Subsequently, the word lines of the cell block BLK1 are successively activated and their connected memory cells C are refreshed. When the refresh operation of the memory cell C connected to the word line BLn corresponding to the last address of the cell block BLK1 is completed, the cell block BLK1 is deactivated. At this time, the clamp address decision circuit 34b generates the address decision signal CLMPAdd1 having the H level. In response thereto, the precharge control circuit 35b supplies the precharge signal PR1 having the ground level to the cell block BLK1. Accordingly, when the cell block BLK1 is deactivated, the potential of the bit line pair BL, /BL is controlled to be substantially equal to the potential on the word line WL, whereby a current consumption due to a current flow through the cross-line defect in the cell block BLK1 is eliminated.

Similarly, the cell blocks BLK2 and BLK3 are successively activated and their connected memory cells C are refreshed. When the refresh operation for the memory cell C connected to the last word line of the cell block BLK3 is completed, the refresh address counter 22 is reset, and the initial refresh address or the refresh address signal IAdd for the word line WL0 of the cell block BLK0 is provided.

FIG. 8 is a circuit diagram of the clamp address decision circuits 34a–34d. The clamp address decision circuit 34a associated with the cell block BLK0 includes NAND circuits 41a, 42a and 43a, and an inverter circuit 44a. Output terminals of the NAND circuits 41a, 42a are connected to the input terminals of the NAND circuit 43a, the output terminal of which is connected to the input terminal of the inverter circuit 44a. The clamp address decision circuits 34b associated with the cell blocks BLK1 comprises NAND circuits 41b, 42b and 43b and an inverter circuit 44b. The clamp address decision circuits 34c associated with the cell blocks BLK2 comprises NAND circuits 41c, 42c and 43c and an inverter circuit 44c. The clamp address decision circuits 34d associated with the cell blocks BLK3 comprises NAND circuits 41d, 42s and 43d and an inverter circuit 44d. Each of the decision circuits 34a–34d has the same structure.

Address signals A5–A0 are provided to NAND circuits 41a–41d, and a pair of non-inverted or inverted address signals A7, A6, /A7, /A6 are also provided to the NAND circuits 41a–41d and to the NAND circuits 42a–42d.

Considering the cell block BLK0, it will be noted that the address signals A5–A0 and non-inverted address signals A7, A6 are provided to the NAND circuit 41a of the decision circuit 34a corresponding to the cell block BLK0. The address signals A5–A0 correspond to an address for activating the last word line Wln of each cell block BLK0–BLK3 while the non-inverted address signals A7, A6 correspond to an address of the cell block BLK3 activated before the cell block BLK0. The inverted address signals /A7, /A6 provided to the NAND circuit 42a correspond to an address for activating the cell block BLK0. Accordingly, the decision block 34a is provided the address decision signal CLMPAddO having an L level before the cell block BLK0 is activated, as illustrated in the chart of FIG. 9.

Similarly, the decision circuits 34b–34d corresponding to the cell blocks BLK1-BLK3 provide the address decision signals CLMPAdd1, CLMPAdd2 and CLMPAdd3 each having an L level, respectively, before each associated cell block BLK1 to BLK3 is activated.

Figure 10:
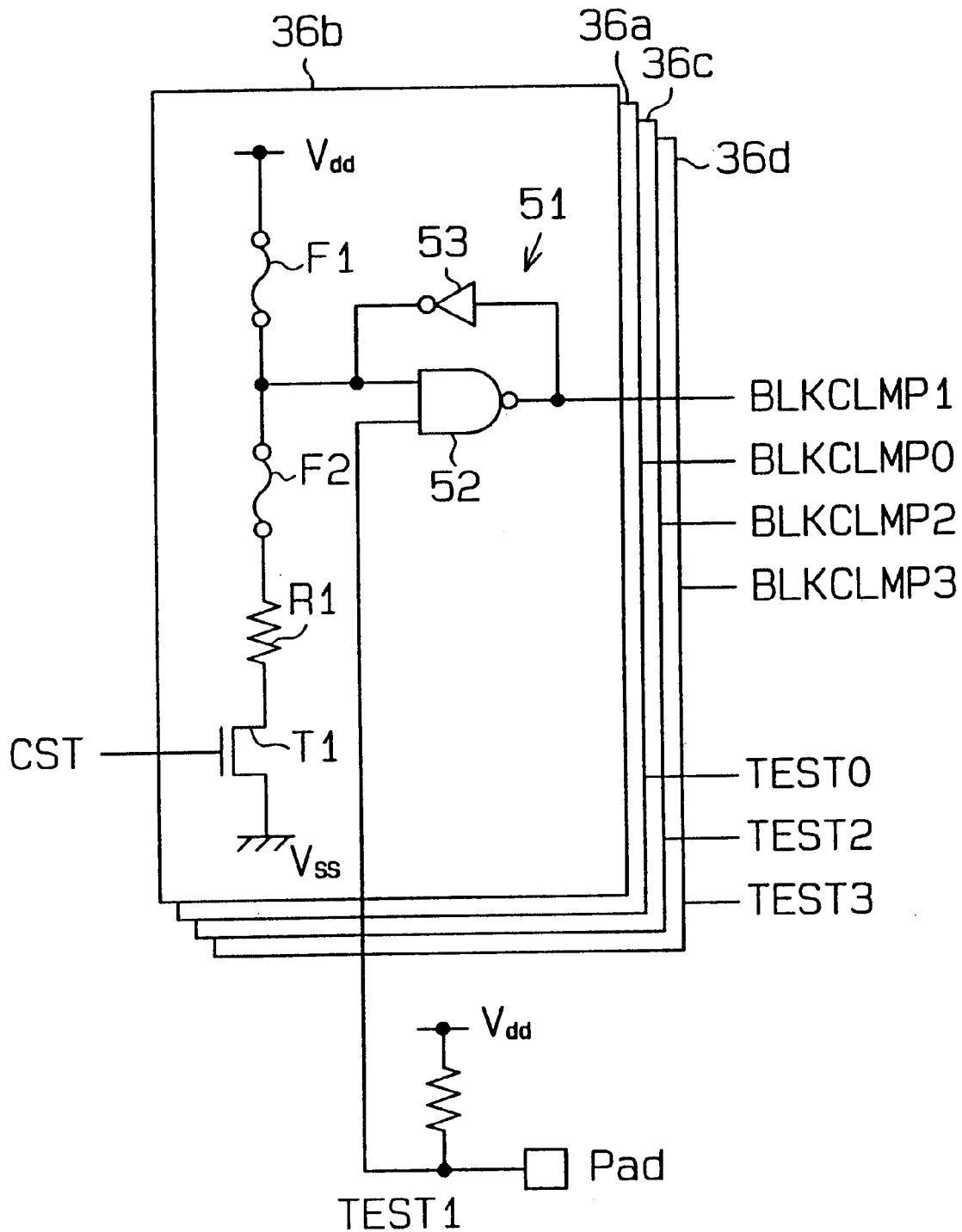
FIG. 10 is a circuit diagram of a block selection circuit of the present invention.

FIG. 10 shows a schematic diagram of the block selection circuits 36a–36d. In FIG. 10, the block selection circuit 36b which receives the level controlling precharge signal PR1 is shown in detail, but it should be understood that the remaining block selection circuits 36a, 36c and 36d have the same structure as the block selection circuit 36b and therefore they are not specifically shown or described.

The block selection circuit 36b comprises first and second fuses F1, F2, a resistor R1, a transistor T1 and a latch circuit 51. The first and second fuses F1, F2, the resistor R1 and the transistor T1 are connected in series between a high potential supply Vdd and ground. The transistor T1 comprises an N channel MOS transistor having a gate, to which a cold start signal CST is applied. The signal CST has an H level for a predetermined time interval when the operation of the DRAM 31 is started, and is produced by a reset circuit(not shown).

The latch circuit 51 comprises a NAND circuit 52 and an inverter circuit 53. The output terminal of the inverter circuit 53 is connected to the first input terminal of the NAND circuit 52 and also to a node between the first and second fuses F1, F2. The output terminal of the NAND circuit 52 outputs a control signal BLKCLMP1.

The second input terminal of the NAND circuit 52 is connected to an external input terminal pad, which is pulled up by a resistor disposed within the DRAM 31 and may be connected to an external testing apparatus. The testing apparatus performs a test of the DRAM 31, and provides a test signal TEST1 to the latch circuit 51 through the external connection terminal pad, thus conducting a determination of defect currents through the respective cell blocks BLK0–BLK3.

It should be understood that the external input terminal pad and a pull-up resistor are provided separately for each block selection circuit 36a–36d, and test signals TEST0–TEST3 are supplied from the testing apparatus to each circuit 36a–36d. Alternatively, the test signals TEST0–TEST3' may be produced within the DRAM 31 and be supplied to the circuits 36a–36d.

Either one of the first and second fuses F1, F2 is broken in accordance with the block selection information stored in the block selection circuit 36b. In the block selection circuit 36b, the first fuse F1 is broken when the circuit 36b stores the block selection information for controlling the level of the precharge signal PR1 while the second fuse F2 is broken when the level of the precharge signal PR1 is not controlled.

When the second fuse F2 is broken, the latch circuit 51 latches the first fuse F1 based information, thus outputting the control signal BLKCLMP1 having the H level. When the first fuse F1 is broken, the latch circuit 51 latches the second fuse F2 based information through the transistor T1, which is activated by the cold start signal CST upon turn-on of the power supply, thus outputting the control signal BLK-CLMP1 having the L level. Thus, the stored block selection information is determined by the cold start signal CST. When the transistor T1 is turned off by the cold start signal CST having the L level, the current flowing through the second fuse F2 is cut off, thereby reducing the current consumption during the normal operation.

Figure 11:
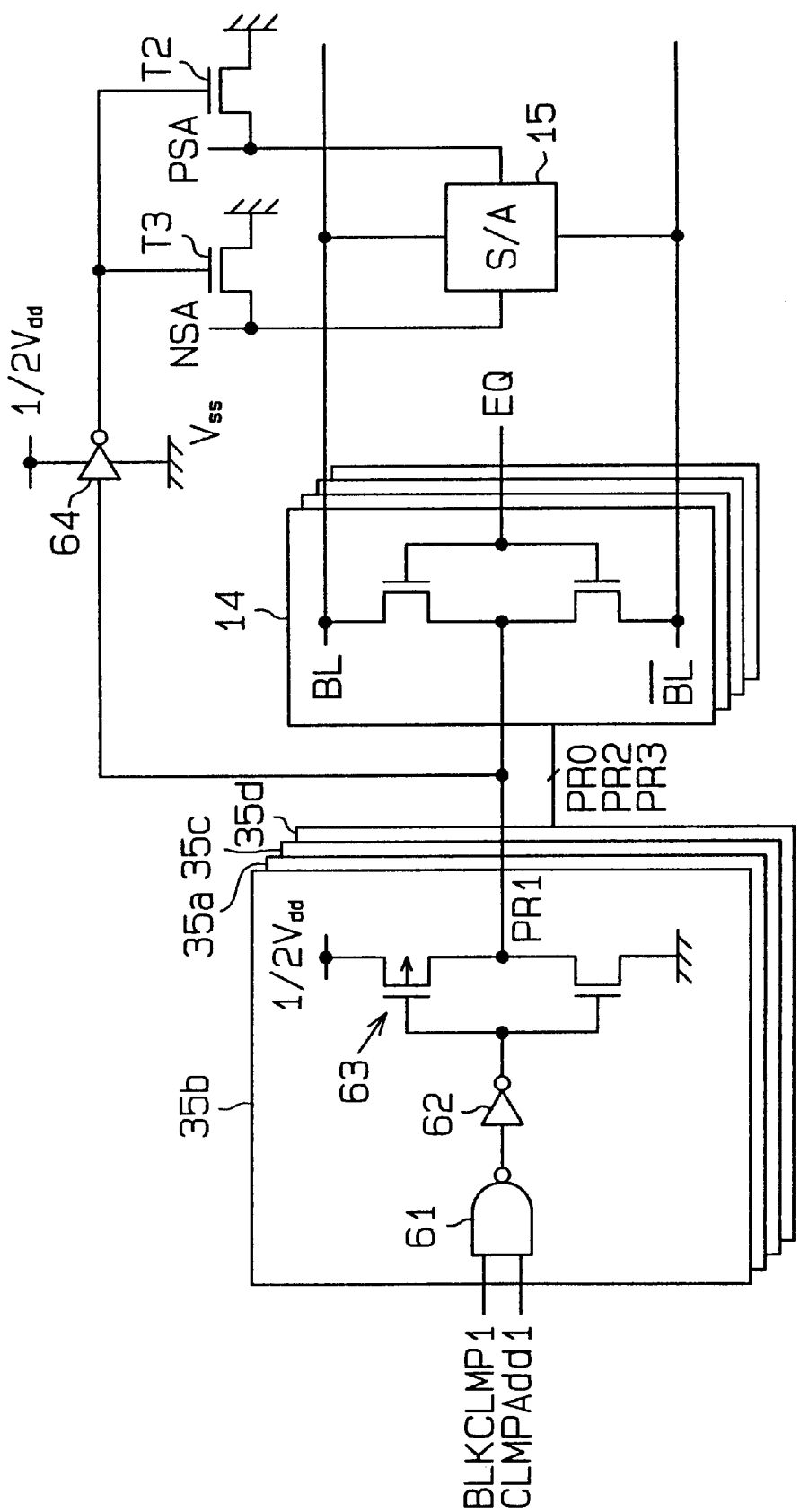
FIG. 11 is a circuit diagram of a precharge control circuit and an equalizer circuit of the present invention.

FIG. 11 shoes a schematic diagram of the precharge control circuits 35a–35d. While only the precharge control circuit 35b is shown in detail in FIG. 11, it should be understood that the remaining precharge control circuits 35a, 35c and 35d are constructed in the same manner as the precharge control circuit 35b and therefore will not be shown or described.

The precharge control circuit 35b comprises a NAND circuit 61 and inverter circuits 62 and 63. The control signal BLKCLMP1 from the block selection circuit 36b and the address decision signal CLMPAdd1 from the clamp address decision circuit 34b are provided to the NAND circuit 61, the output terminal of which is connected to the input terminal of the inverter circuit 62, the output terminal of which is in turn connected to the input terminal of the inverter circuit 63.

The inverter 63 functions as a level conversion circuit. Specifically, the NAND circuit 61 and the inverter circuit 62 are driven by the high potential supply Vdd while the inverter circuit 63 is driven by the precharge level equal to one-half Vdd. Accordingly, in response to the control signals BLKCLMP1 and CLMPAdd1, the precharge control circuit 35b provides the precharge signal PL1 of either one-half Vdd level or the ground level to the equalizer circuit 14 of the cell block BLK1.

The precharge signal PR1 is supplied through an inverter circuit 64 of the cell block BLK1 to the gates of the transistors T2, T3, which are connected between the power supplies PSA and NSA which feed the sense amp 15 and the ground. In this manner, the levels of the power supplies PSA and NSA are controlled by the precharge signal PR1. This reduces the current consumption in the sense amp 15.

Figure 2:
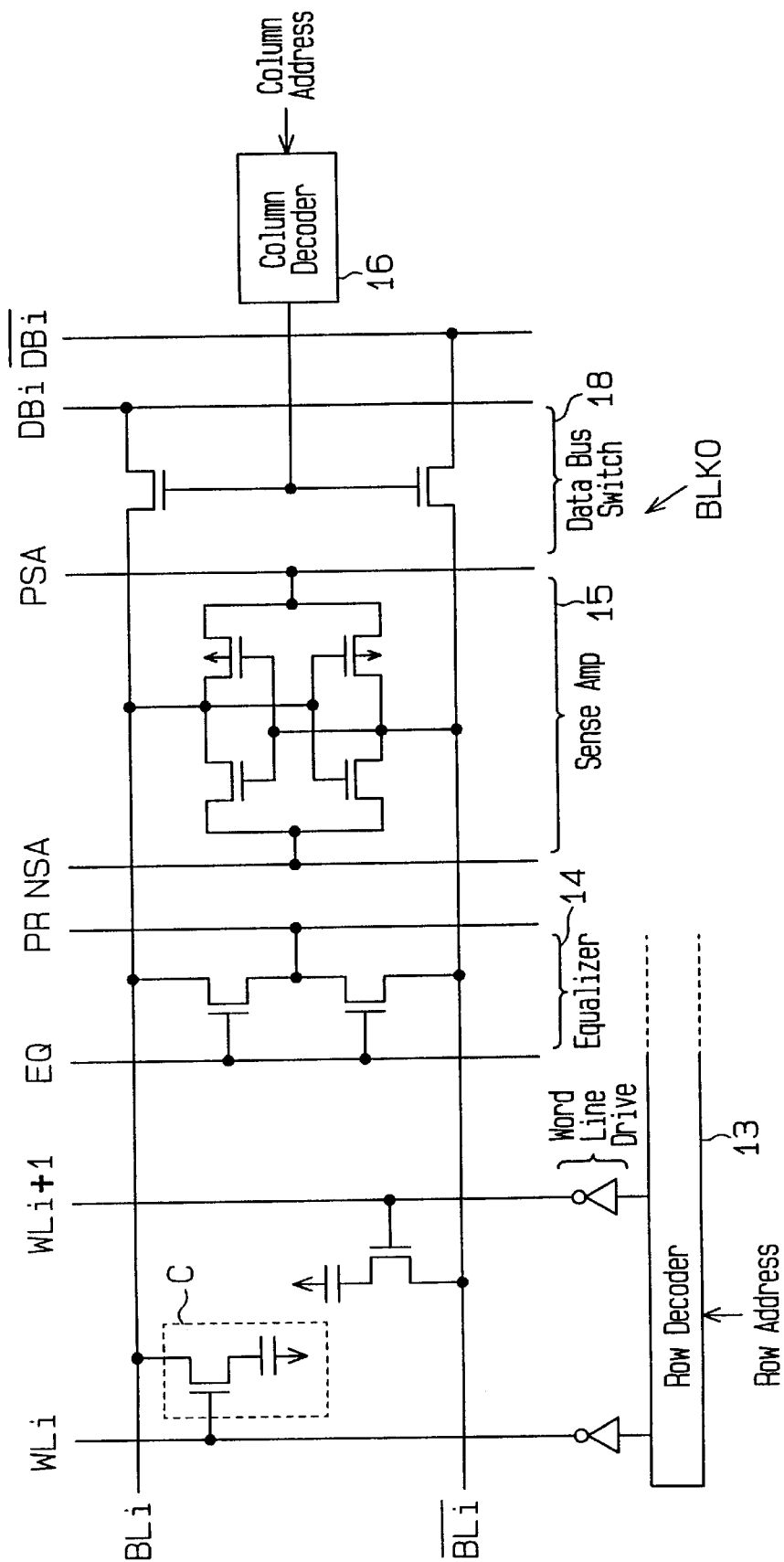
FIG. 2 is a circuit diagram of a cell block of the DRAM of FIG. 1.

As shown in FIG. 2, the sense amp 15 comprises a pair of inverter circuits having their input and output terminals connected together. When the bit line pair BLi, /BLi connected to the input and output terminals of the inverter circuits are set to the ground level, P channel MOS transistors of the inverter circuits are turned on when the power supplies PSA and NSA are at their one-half Vdd level, which causes a current flow into the bit line pair BLi, /BLi, and producing a current consumption.

A method for determining block selection information for the cell blocks BLK0–BLK3 will now be described.

In a probing test, an external testing apparatus applies test signals TEST0–TEST3 to the block selection circuits 36a–36d through the external connection terminal pad, respectively (see FIG. 10).

The testing apparatus supplies the test signals TEST0–TEST3 having the H level. In response, the block selection circuits 36a–36d deliver control signals BLKCLMP0–BLKCLMP3 having the L level to the precharge control circuits 35a–35d. The precharge control circuits 35a–35d control the levels of the precharge signals PR0–PR3 supplied to the cell blocks BLK0–BLK3 in accordance with the address decision signals CLMPAdd0–CLMPAdd3 from the clamp address decision circuits 34a–34d, respectively. Accordingly, by choosing one of the test signals TEST0–TEST3 to be an H level while choosing the others to have an L level and sequentially changing the test signals, the current consumption of the cell blocks BLK0–BLK3 is measured when the precharge level is controlled. The current consumption may be called a first current value Icc2SRD0-Icc2SRD3.

Subsequently, test signals TEST0–TEST3 having the ground level are supplied from the testing equipment, and the resulting current consumption is determined, which may be referred to as a second current value Icc2SRE. By determining the difference between the first current value Icc2SRD0-Icc2SRD3 and the second current value Icc2SRE, the magnitude of any defect current which may be present within each cell block BLK0–BLK3 can be determined.

Block selection information to be stored in each block selection circuit 36a–36d may be determined on the basis of the results of tests and the results of normal detection of defective memory cells, and either the first fuse F1 or the second fuse F2 in each block selection circuit 36a–36d may be broken in accordance with the determined information.

In the probing test mentioned above, where there are a plurality of cell blocks which contain cross-line defects, a fuse or fuses in the block selection circuits 36a–36d are sequentially broken beginning with the cell block which contains the maximum defect current on the basis of the test result. If all four of the cell blocks contain defect currents, the first fuse F1 of all of the block selection circuits 36a–36d will be broken. As a consequence, the defect currents of the cell blocks BLK0–BLK3 can be substantially eliminated. Although the number of the charge-discharge processes applied to the bit line pair BLi, /BLi on the basis of the precharge signals PR0–PR3 will increase, causing an increase in the current consumption, the power dissipation of the DRAM 31, inclusive of an increase in the current consumption, and a reduction in the defect current can be controlled within a predetermined value.

It is to be noted that if the first fuses F1 of all of the block selection circuits 36a–36d are actually broken, the self-refresh currents of the cell blocks BLK0–BLK3 are reduced to a significant degree. One cycle of the refresh operation takes about 100 ns, requiring a total time of 25.6 μs for all of 256 word lines. The refresh time of 2 ms includes an active interval of the refresh operation and a standby interval, the greater proportion of which essentially comprises the standby interval. The number of times that a single block is precharged from Vss level to one-half Vdd level is only once among all of the refresh times, which means that such times of precharging the blocks is equal to only four, and this does not cause any significant increase in the current consumption.

The present embodiment has the following effects:

(1) The plurality of block control circuits 33a–33d control the level of the precharge signals PR0–PR3 in accordance with the accessed conditions of the cell blocks BLK0–BLK3 such that the level of the precharge signal is coincident with the reset level of the word line WL. As a consequence, the levels between the bit line pair BL, /BL and the word line WL are coincident and a defective current does not flow through the cross-line defect, thus reducing a current flow due to process errors and thus reducing the power dissipation during the self-refresh operation.

(2) Each of the block control circuits 33a–33d controls the level of the precharge signal PR0–PR3 in accordance with the refresh address signal IAdd supplied from the refresh address counter 22 before each associated cell block BLK0–BLK3 is activated. As a consequence, when each cell block BLK0–BLK3 is activated, the bit line pair BL, /BL assumes the precharge level, allowing a rapid refresh operation without causing a timing offset.

(3) Each of the block control circuits 33a–33d maintains the precharge signal PR0–PR3 at its precharge level for those cell blocks BLK0–BLK3 for which no defect is established. As a consequence, the charge/discharge operation is not performed, thus preventing the current consumption from increasing.

It should be apparent to those skilled in the art that the present invention may be embodied in many other specific forms without departing from the spirit or scope of the invention. Particularly, it should be understood that the invention may be embodied in the following forms:

The precharge signal PR0–PR3 is set to the ground level before one of the cell blocks BLK0–BLK3 which contains a defect current is activated. However, the set timing may be changed in a suitable manner. For example, the precharge signal PR0–PR3 may be set when activating the cell blocks BLK0–BLK3. In this instance, the control signals BLKCLMP0–BLKCLMP3 of the block selection circuits 36a–36d may be replaced by an internal signal within the redundancy decision circuit 24.

Figure 12:
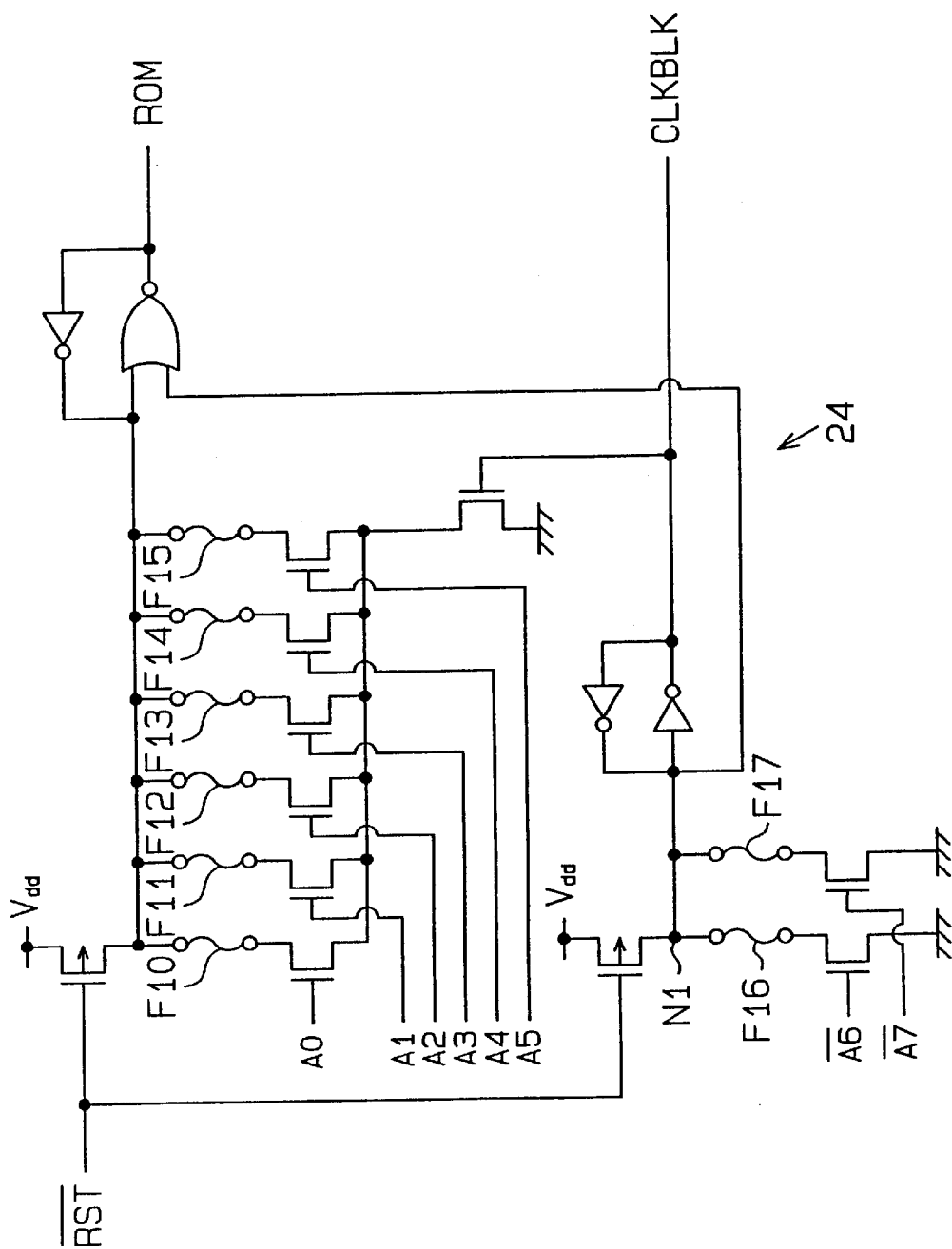
FIG. 12 is a circuit diagram of a redundancy decision circuit of the present invention.

FIG. 12 is a schematic circuit diagram of the redundancy decision circuit 24. The decision circuit 24 includes a plurality of fuses F10–F17, which are equal in number to the number of address signals, to be used as a redundancy ROM which stores fuse breakage information corresponding to a defective address in order to salvage a defective memory cell. The defective address formed by the fuses F10–F17 are compared against the address signals A7–A0 supplied from the refresh address counter 22 bit by bit, and a redundancy control signal ROM having a level which depends on a result of such comparison is delivered.

A node N1 precharged to the Vdd level by the row reset signal RST may change to an L level when the status of the fuses F16 and F17 representing defective cell block information and the block selection address signals A6–A7 are coincident each other. The level of the redundancy control signal ROM is determined by the resulting signal CLKBLK, the remaining address signals A0–A5 and the status of the fuses F10–F15.

Accordingly, the signal CLKBLK assumes an H level to access a cell block for which the redundancy is required, and assumes an L level for other cell blocks. The signal CLKBLK may be used in place of the control signals BLKCLMP0–BLKCLMP3 while allowing the level of the precharge signal PR0–PR3 to be controlled in the same manner as in the described embodiment, which permits the block selection circuits 36a–36d to be omitted.

The present invention is embodied in the DRAM 31 which is provided with the redundant word line RWL, but may also be employed in a DRAM provided with a redundant bit line, or a DRAM provided with a redundant word line and a redundant bit line.

In the described embodiment, the DRAM 31 is provided with four cell blocks BLK0–BLK3, but such embodiment may be embodied in a DRAM having three or less or five or more cell blocks.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
    a plurality of cell blocks each having bit lines and word lines; and
    a plurality of block control circuits connected to the plurality of cell blocks, respectively, for supplying a precharge signal to the bit lines of an associated cell block, wherein the block control circuit corresponding to a defective cell block generates the precharge signal having one of a precharge level of the bit lines and a reset level of the word lines in accordance with an access condition of the defective cell block.

2. The device according to claim 1, wherein each of the block control circuits sets the precharge signal to its precharge level when the defective cell block is activated and sets the precharge signal to the reset level when the defective cell block is deactivated.

3. The device according to claim 2 further comprising a refresh address counter for outputting a refresh address signal, wherein each of the block control circuits receives the refresh address signal output from the refresh address counter and changes the precharge signal from the reset level to the precharge level before the defective cell block is activated.

4. The device according to claim 3, wherein when the refresh address signal for activating a last word line of the cell block that has been activated before the defective cell block is output from the refresh address counter, each of the block control circuits sets the precharge signal to its precharge level.

5. The device according to claim 3, wherein each of the block control circuits includes:
    an address decision circuit connected to the refresh address counter for producing an address decision signal in accordance with the refresh address signal; and
    a precharge control circuit connected to the address decision circuit for controlling the level of the precharge signal in accordance with the address decision signal.

6. The device according to claim 5, wherein each of the block control circuits further includes a block selection circuit connected to the precharge control circuit for storing block selection information relating to the defective cell block and for generating a control signal according to the block selection information,
    wherein the precharge control circuit controls the level of the precharge signal in accordance with the control signal and the address decision signal.

7. The device according to claim 6, wherein the block selection circuit establishes the level of the control signal according to the block selection information when the operation of the block selection circuit is initiated.

8. The device according to claim 5 further comprising a redundancy decision circuit for generating a redundancy decision signal used to replace a word line located at a defective address in one of the cell blocks by a redundant word line in accordance with the address signal,
    wherein the precharge control circuit controls the level of the precharge signal in accordance with the redundancy decision signal.

9. The device according to claim 1, wherein each of the block control circuits receives a test signal used in a probing test to detect defective cell blocks.

10. The device according to claim 1, wherein each of the block control circuits maintains the level of the precharge signal supplied to the cell blocks other than the defective cell block at the precharge level.

11. The device according to claim 1, wherein the defective cell block is previously determined on the basis of at least one of a number of defective addresses within each cell block and the value of a defect current.

12. The device according to claim 11, wherein the defective address refers to an address where a cross-line defect representing an electrical short circuit across a bit line and a word line in one cell block occurs and the defect current refers to a current flow through the cross-line defect.

* * * * *

UNITED STATES PATENT AND TRADEMARK OFFICE
CERTIFICATE OF CORRECTION

PATENT NO. : 6,185,137 B1
DATED : February 6, 2001
INVENTOR(S) : Hajime SATO et al.

Page 1 of 1

It is certified that error appears in the above-identified patent and that said Letters Patent is hereby corrected as shown below:

On the Title Page, Item (30)   Change "11-0752425" to --11-075242--.

Signed and Sealed this

Fifth Day of June, 2001

*Attest:*

*Attesting Officer*

NICHOLAS P. GODICI
*Acting Director of the United States Patent and Trademark Office*